(12) United States Patent
Kompaniets et al.

(10) Patent No.: US 11,747,197 B2
(45) Date of Patent: Sep. 5, 2023

(54) PHOTOMETER AND METHOD OF PERFORMING PHOTOMETRIC MEASUREMENTS WITH A PHOTOMETER

(71) Applicant: Endress+Hauser Conducta, Inc., Anaheim, CA (US)

(72) Inventors: Iouri Kompaniets, Running Springs, CA (US); Jesus Godinez, Chino, CA (US); Ahmed Fathalla, Irvine, CA (US); Budi Komala, Anaheim, CA (US)

(73) Assignee: Endress+Hauser Conducta, Inc., Anaheim, CA (US)

( * ) Notice: Subject to any disclaimer, the term of this patent is extended or adjusted under 35 U.S.C. 154(b) by 120 days.

(21) Appl. No.: 17/447,770

(22) Filed: Sep. 15, 2021

(65) Prior Publication Data
US 2023/0077628 A1    Mar. 16, 2023

(51) Int. Cl.
*G01J 1/46* (2006.01)
*G01J 1/04* (2006.01)
(Continued)

(52) U.S. Cl.
CPC .............. *G01J 1/46* (2013.01); *G01J 1/0488* (2013.01); *G02B 7/006* (2013.01); *G02B 26/007* (2013.01);
(Continued)

(58) Field of Classification Search
CPC . G01N 21/274; G01N 21/27; G01J 2001/188; G01J 2001/444; G01J 1/186;
(Continued)

(56) References Cited

U.S. PATENT DOCUMENTS 7,773,134 B2 * 8/2010 Tan ................. G01J 1/0252
                                             348/241
10,187,026 B2 * 1/2019 Zamprogno ............ H03G 3/30
(Continued)

FOREIGN PATENT DOCUMENTS

| DE | 3138879 A1 | 4/1993 |
| DE | 102005033327 A1 | 1/2007 |
| WO | 2009027102 A2 | 3/2009 |

*Primary Examiner* — John R Lee
(74) *Attorney, Agent, or Firm* — Mark A. Logan; Endress+Hauser (USA) Holding, Inc.

(57) ABSTRACT

A photometer and a method of performing photometric measurements with this photometer are described. The photometer comprises a photodetector providing a detector signal corresponding to an intensity of light received by the photodetector; and measurement electronics including: an amplifier and a signal processing device configured to determine and to provide a measurement result based on a measurement signal determined by the signal processing device as or based on an amplified detector signal provided by the amplifier. The signal processing device is configured to determine the measurement signal: a) as or based on the amplified detector signal provided by the amplifier being a multistage amplifier including a transimpedance converter and a voltage to current amplifier; and/or b) in form of a noise reduced signal determined by subtracting a previously determined noise offset included in the amplified detector signal from the amplified detector signal.

20 Claims, 4 Drawing Sheets

(51) Int. Cl.
  *G02B 7/00*   (2021.01)
  *G02B 26/00*  (2006.01)
  *H03F 3/45*   (2006.01)
  *G01J 1/44*   (2006.01)

(52) U.S. Cl.
  CPC .... *H03F 3/45475* (2013.01); *G01J 2001/444* (2013.01)

(58) Field of Classification Search
  CPC ........ G01J 1/18; G01J 1/16; G01J 1/04; G01J 1/0488; G01J 1/44; G01J 1/46; G02B 26/007; G02B 26/006; H03F 3/456; H03F 3/45071; H03F 3/45; H03F 3/45596; H03F 3/45475
  See application file for complete search history.

(56)  References Cited

U.S. PATENT DOCUMENTS

| | | | |
|---|---|---|---|
| 10,447,402 B2 * | 10/2019 | Kim | H04B 10/69 |
| 10,557,940 B2 * | 2/2020 | Eichenholz | G01S 7/4804 |
| 2014/0111280 A1 * | 4/2014 | Schuppener | H03F 3/456 |
| | | | 330/291 |
| 2018/0131342 A1 * | 5/2018 | Zamprogno | H03F 3/45973 |
| 2020/0186098 A1 * | 6/2020 | Basilico | H03F 1/086 |
| 2021/0091734 A1 * | 3/2021 | Adut | H03M 1/124 |
| 2022/0109508 A1 * | 4/2022 | Yoshima | H04B 10/6931 |
| 2022/0140795 A1 * | 5/2022 | Adut | H03F 3/68 |
| | | | 330/260 |
| 2022/0181134 A1 * | 6/2022 | Volkovoy | H03F 1/08 |
| 2022/0214212 A1 * | 7/2022 | Horiguchi | G01J 1/44 |
| 2022/0397454 A1 * | 12/2022 | Feuerstein | G01J 1/46 |

\* cited by examiner

PHOTOMETER AND METHOD OF PERFORMING PHOTOMETRIC MEASUREMENTS WITH A PHOTOMETER

TECHNICAL FIELD

The present disclosure relates to photometers and to methods of performing photometric measurements with photometers.

BACKGROUND

Photometers commonly include a photodetector and measurement electronics connected to the photodetector. The photodetector receives incident light and provides a detector signal corresponding to an intensity of the light received by the photodetector. Based on the detector signal, the measurement electronics determines and provides a measurement result corresponding to the intensity of the light received by the photodetector.

Conventional photometers include measurement instruments configured to measure a variable given by or corresponding to the intensity of the light received by the photodetector, as well as photometric sensors configured to perform photometric measurements of a variable of a medium, e.g. a variable of a liquid, a gas, a solid or a multiphase mixture. Photometric sensors include absorption sensors measuring absorption of the medium, concentration sensors measuring a concentration of an analyte contained in the medium, turbidity sensors measuring a turbidity of a medium, as well as fluorescence light sensors measuring variables given by or related to an intensity of fluorescence light emitted by the medium.

Examples of photometric absorption sensors are disclosed in US2015/0189714 A1 and in U.S. Pat. No 10,436,709 B2.

Measurement results of photometric measurements are employed in a large variety of different applications including industrial applications, as well as laboratory applications. As an example, measurement results of photometric measurements are e.g. employed to monitor, to regulate and/or to control the variable measured and/or to issue an alarm when measured values of the variable measured exceed a predetermined value range. As another example, measurement results of photometric measurements are commonly used in process automation, as well as in quality control to monitor, to regulate and/or to control at least one of: the variable measured, an operation of a facility, e.g. a production facility, and at least one step of a process, e.g. a production process. For example, in a chemical production process, concentrations of reactants used in the production process and/or the concentration of analytes contained in pre-products, intermediate products and/or educts produced by the process can be monitored, and a process sequence of process steps of the production process can be scheduled, controlled and/or regulated based on measurement results determined by photometric measurements.

Depending on the application, an efficiency and/or a productivity of a production process, a product quality of products produced and/or the safety of operation of facilities, industrial plants and/or laboratories may by depend on the measurement properties of photometers used to perform the photometric measurements.

Correspondingly, there is a desire to improve the measurement properties, e.g. the measurement accuracy and/or the measurement resolution, of photometers.

One of the limiting factors with respect to improvements of both the measurement accuracy and the measurement resolution of photometers is the limited output range of detector signals provided by photodetectors conventionally used in photometers.

Certain improvements can be attained by amplifying the detector signal. Amplifiers suitable for this purpose include transimpedance amplifiers including an operational amplifier and a feedback resistor disposed in a feedback loop connecting an output of the operational amplifier to an inverting input of the operational amplifier receiving the detector signal. However, amplifying the detector signal unavoidably also amplifies a detector noise included in the detector signal, e.g. noise due to a dark current of the photodetector, and a signal-to-noise ratio of the amplified detector signal is further reduced due to an additional amplifier noise. A further disadvantage is, that both gain and amplifier noise of transimpedance amplifiers are proportional to the size of the feedback resistor. Consequently, increasing the gain of a transimpedance amplifier is always associated with a corresponding increase of the amplifier noise.

Once the noise included in the amplified detector signal exceeds a certain noise level, increasing the gain of the amplifier any further neither improves the measurement accuracy nor the measurement resolution. In consequence, improvements of the measurement properties of photometers attainable by amplifying the detector signal are limited.

This is especially disadvantageous, with respect to photometric measurements of variables having a logarithmic dependency on the intensity of the light received by the photodetector.

As an example, absorption of a medium is commonly measured by transmitting light provided by a light source along an optical path extending through the medium to the photodetector. Due to the exponential attenuation of radiation along the optical path, absorption is a logarithmic function of a ratio of the intensity of the light received by the photodetector and a reference intensity, e.g. a reference intensity given by an initial intensity of the light provided by the light source. Thus, a linear increase of the measurement resolution of an absorption sensor requires an exponential increase of the measurement resolution of the intensity measurement and a linear increase of a measurement error of the intensity measurement causes an exponential increase of the measurement error of the absorption measurement.

The same problem occurs when the concentration of an analyte contained in the medium is measured. According to Beer-Lambert's Law given by: $A=\varepsilon lC$, absorption A due to an attenuating analyte contained in a medium is given by a product of an absorptivity of the analyte $\varepsilon$, a path length l of the optical path extending through the medium and the concentration C of the analyte. Correspondingly just like absorption, concentration is a logarithmic function of the ratio of the intensity measured by the photometer and the reference intensity.

In a variety of applications it is advantageous to perform photometric measurements in a limited wave length range. As an example, when a concentration of an analyte contained in a medium is measured, the photometric measurement is e.g. performed in a limited wave length range corresponding to a spectral absorption line of the analyte. A limitation of photometric measurements to a specific wave length range is attainable by disposing a band pass filter into the optical path extending from the light source to the photodetector. When only a single application is considered, a band bass filter having a narrow band width and a center wave length equal to the spectral line of interest in the specific application would be advantageous. A narrow bandwidth does however limit the field of use of the photometer to applications where the spectral lines of interest occur within the narrow band width of the filter. Thus, a large variety of photometers, each including a different band pass filter, would be required to satisfy the requirements of various different applications.

This problem could at least in part be overcome by using a band pass filter having a wider bandwidth to cover a wider range of application specific spectral lines with only one filter.

A wider bandwidth is however associated with a corresponding reduction of the transmittance of the band pass filter with respect to individual spectral lines that may be of interest, which in turn reduces the measurement properties, e.g. the measurement accuracy and/or the measurement resolution, of the photometer. Another disadvantage is the reduction of the spectral resolution associated with enlarging the bandwidth. This is e.g. disadvantageous in applications where the medium includes at least two analytes absorbing light at different absorption lines within the bandwidth of the band pass filter. In this case, it may be very difficult or even impossible to determine absorption caused by an individual one of the analytes.

Accordingly, there remains a need for further contributions in this area of technology.

As an example, there is a need for a photometer having improved measurement properties, e.g. an improved measurement accuracy and/or an improved measurement resolution.

SUMMARY

The present disclosure includes a photometer comprising:
- a photodetector configured to provide a detector signal corresponding to an intensity of light received by the photodetector; and
- measurement electronics including: an amplifier connected to the photodetector and a signal processing device connected to the amplifier and configured to determine and to provide a measurement result corresponding to an intensity of the light received by the photodetector based on a measurement signal determined by the signal processing device as or based on an amplified detector signal provided by the amplifier; wherein the signal processing device is configured to determine the measurement signal:
a) as or based on the amplified detector signal provided by the amplifier being a multistage amplifier including a transimpedance converter connected to the photodetector and a voltage to current amplifier connected to the transimpedance converter; and/or
b) in form of a noise reduced signal determined by subtracting a previously determined noise offset included in the amplified detector signal from the amplified detector signal.

The photometer provides the advantage that the measurement signal employed to determine the measurement result has a high signal-to-noise ratio. This results in the photometer having improved measurement properties, in particular a higher measurement accuracy and/or a higher measurement resolution.

In this respect, the multistage amplifier provides the advantage that a gain of the voltage to current amplifier can be increased without a causing a correspondingly high increase of the amplifier noise of the multistage amplifier. This enables for the amplifier noise of the multistage amplifier to be kept at a low level even when a gain of the multistage amplifier is high.

In the same context, the signal processing device subtracting the previously determined noise offset provides the advantage, that at least most of the noise included in the amplified detector signal is essentially eliminated. This provides a significant improvement of the signal-to-noise ratio of the measurement signal employed to determine the measurement result. In addition, it provides the advantage, that a higher gain of the amplifier can be applied without causing a correspondingly high increase of the noise included in the measurement signal.

Further, the combination of the large amplification of the detector signal and the low signal-to-noise ratio of the measurement signal provides the advantage of a high measurement accuracy, as well as a high measurement resolution of the photometer.

In an embodiment, a gain of the voltage to current amplifier is larger or an order of a magnitude larger than a gain of the transimpedance converter.

In certain embodiments the transimpedance converter has a fixed or adjustable gain smaller or equal to 20 or a fixed or adjustable gain larger gain larger or equal to 5 and smaller or equal to 20; and the voltage to current amplifier has a fixed or adjustable gain larger or equal to 100 or a fixed or adjustable gain larger or equal to 100 and smaller or equal to 800.

In another embodiment, the amplifier is an amplifier having an adjustable gain; and the signal processing device is configured to determine the noise reduced signal based on a gain setting of the amplifier gain applied during a photometric measurement performed with the photometer and the corresponding noise offset given by a gain-specific noise offset previously determined for the respective gain setting.

In other embodiments, the photometer comprises at least one of: a light source; a measurement region configured to accommodate the medium or a sample of the medium, a measurement region given by a chamber or a recess configured to be filled with medium when the photometer is immersed in the medium or a measurement region given by an interior of a measurement cell or by an interior of a flow cell; and an interface, a communication interface, a user interface or an interface including at least one of: at least one operating element including at least one of: a display and at least one operating element, the at least one operating element including at least one of: at least one switch, at least one key, at least one input device, at least one element configured to enable adjusting a gain setting of a gain of the amplifier, a dip switch configured to enable adjusting a gain setting of again of the transimpedance converter and a dip switch configured to enable adjusting a gain setting of a gain of the voltage to current amplifier.

Further embodiments include the photometer being a measurement instrument measuring at least one variable corresponding to the intensity of the light received by the photodetector, the at least one variable including at least one of: the intensity of the light received by the photodetector, an intensity ratio corresponding to the intensity of the light received by the photodetector divided by a reference intensity and at least one variable determinable based on at least one of: the intensity and the intensity ratio; or the photometer being a photometric sensor measuring at least one variable of a medium, a fluorescence sensor measuring a variable given by or corresponding to an intensity of fluorescent light emitted towards the photodetector by the medium, a turbidity sensor measuring a turbidity of the medium, a turbidity sensor measuring turbidity based on the intensity of light scattered towards the photodetector by the medium, an absorption sensor measuring absorption based on an intensity ratio corresponding to the intensity of light transmitted to the photodetector through the medium divided by a reference intensity, or a concentration sensor measuring a concentration of an analyte contained in the medium based on an intensity ratio corresponding to the intensity of light transmitted to the photodetector through the medium divided by a reference intensity; and the measurement result includes at least one of: measured values of at least one of the least one variable measured by the photometer; and measured values of at least one of the least one variable measured by the photometer determined by the signal processing device based on the measurement signal and a previously determined relationship between a signal amplitude of the measurement signal and the measured values; wherein the measurement signal is either given by the amplified detector signal provided by the multistage amplifier or by the noise reduced signal.

In certain embodiments, the photodetector is or includes at least one charge-coupled device, at least one photodiode, a silicon based photodetector, a silicon carbide based photodetector, a photomultiplier tube or another type of photodetector; and/or the amplifier is either configured as a signal polarity power supply amplifier or as a dual polarity power supply amplifier.

According to a first embodiment: the transimpedance converter includes: an operational amplifier having an inverting input connected to an output of the photodetector and a non-inverting input connected to a reference potential; and a feedback loop connecting an output of the operational amplifier to the inverting input of the operational amplifier; wherein the feedback loop either includes a feedback resistor disposed in a line segment of the feedback loop or includes: a set of at least two line segments, each having a first end connected to a first end section of the feedback loop and a second end connected to a switch or a to a switch given by a dip switch, and a feedback resistor of a different size disposed in each one of the line segments; wherein the switch connected to each of the line segments is connected to a second end of the feedback loop; and wherein the switch is configured to be operated in a number of different switch settings such, that in each switch setting a different one of the line segments is connected to the second end of the feedback loop; and/or the voltage to current amplifier includes a converter and an electronically controllable current source; wherein the converter includes an operational amplifier configured to provide a control signal corresponding to a voltage provided by the transimpedance converter to a control port of the electronically controllable current source; and wherein the electronically controllable current source is configured to provide a current corresponding to the control signal; wherein the electronically controllable current source is either connected to an output of the voltage to current amplifier via gain limiting resistor or via a switch or a switch given by a dipswitch, wherein the switch is connected to a set of lines connected in parallel to each other to the output of the voltage to current amplifier, wherein a gain limiting resistors of a different size is disposed in each one of the lines, and wherein the switch is configured to be operated in a number of different switch settings such, that in each switch setting the output of the electronically controllable current source is connected to the output of the voltage to current amplifier via a different one of the gain limiting resistors.

In a further embodiment, the voltage to current amplifier includes: an operational amplifier having a non-inverting input connected to the output of the transimpedance converter; and a transistor having a collector connected to a supply voltage, a gate connected to an output of the operational amplifier and an emitter connected to an inverting port of the operational amplifier and connected to an output of the voltage to current amplifier via a gain limiting resistor disposed between the emitter and the output of the voltage to current amplifier.

In an embodiment, the photometer according to the first embodiment additionally comprises at least one of: a compensation capacitor for each feedback resistor of the transimpedance converter, wherein each compensation capacitor is connected in parallel to the respective feedback resistor; at least one filter or at least one filter including a capacitor, wherein each filter is connected to a supply line connecting the operational amplifier of the transimpedance converter to a supply voltage powering this operational amplifier; at least one filter or at least one filter including a capacitor, wherein each filter is connected to a supply line connecting the operational amplifier of the voltage to current amplifier to a supply voltage powering this operational amplifier; and a resistance-capacitance element including a resistor connected in series to the output of the operational amplifier of the transimpedance converter and a capacitor connecting this resistor to a reference potential.

In certain embodiments, the photometer is configured to: be operated in at least two different operation modes including a set up mode and a measurement mode, wherein each mode is selectable via an interface of the photometer; and in the set up mode upon receipt of a start command indicating that the photodetector is exposed to reference conditions determine the noise offset included in the amplified detector signal as or based on a signal amplitude of the amplified detector signal provided by the amplifier while the photodetector is exposed to the reference conditions.

A second embodiment of the photometer comprises: a light source; a measurement region configured to accommodate the medium or a sample of the medium, a measurement region measurement region given by a chamber or a recess configured to be filled with medium when the photometer is immersed in the medium or a measurement region given by an interior of a measurement cell or by an interior of a flow cell; and a filter disposed in an optical path extending from the light source through the measurement region to the photodetector; wherein the filter is a band pass filter rotatably mounted and configured such, that a center wave length of the filter is adjustable by adjusting an angle of incidence between the optical path and a normal to a filter surface of the filter by rotating the filter around an axis of rotation perpendicular to the optical path.

In an embodiment of the photometer according to the second embodiment, the angle of incidence is adjustable within an angle range of 0° to 30°.

In an embodiment of the photometer according to the second embodiment, the filter is mounted onto a support extending through an opening of a housing accommodating the filter; the housing is configured and positioned such, that the optical path extending through the housing extends through a center section of the filter, and the support is rotatably secured on the housing.

In an embodiment, the photometer according to the second embodiment further comprises at least one of: an adjuster configured to enable and/or to perform adjustments of the center wave length by adjusting the angle of incidence by rotating the filter; a dial, a knob or another device connected to the filter and configured to enable manual adjustment of the center wave length by adjusting the angle of incidence by rotating the filter; and an actuator configured to rotate the filter according to a control command provided to the actuator.

In an embodiment of the photometer according to the second embodiment: the light source is configured to provide ultraviolet light; and the photodetector is a silicon carbide detector.

The present disclosure further discloses a method of performing photometric measurements with the photometer disclosed herein, wherein the signal processing device is configured to determine the measurement signal in form of the noise reduced signal, the method comprising: a first step of determining at least one noise offset by: exposing the photodetector to reference conditions wherein an intensity of the light received by the photodetector is essentially equal to a constant intensity smaller or equal to a lower limit of an intensity measurement range of the photometer; recording the amplified detector signal provided by the amplifier at a time when or during a time period wherein the photodetector is exposed to the reference conditions; and determining the respective noise offset as or based on a signal amplitude of the previously recorded amplified detector signal; and a second step of with the photometer performing at least one photometric measurement by: exposing the photodetector to measurement conditions, wherein the light received by the photodetector corresponds to the variable to be measured; amplifying the detector signal provided by the photodetector and determining the measurement signal in form of the noise reduced signal by subtracting the previously determined noise offset from the amplified detector signal; and based on the measurement signal determining the measurement result corresponding to the variable measured.

In an embodiment of the method, a gain of the amplifier is adjustable to at least two different gain settings; the first step includes determining a gain specific noise offsets for at least one, for at least two or for each of the gain settings, wherein each noise offset given by one of these gain specific noise offsets is determined while the amplifier is operating in the respective gain setting; and the second step includes determining the noise reduced signal based on the gain setting of the amplifier gain applied during the respective photometric measurement by subtracting the noise offset given by the gain-specific noise offset previously determined for the respective gain setting.

In certain embodiments of the method, the reference conditions are reference conditions wherein the photodetector is covered, or reference conditions wherein a light source providing the light received by the photodetector during measurement operation of the photometer is turn off.

In certain embodiments, the method further comprises a method step of following the performance of the first step and preceding the performance of the second step determining a relationship between a signal amplitude of the measurement signal given by the noise reduced signal and the measured values of the variable measured by the photometer by: with the photometer performing calibration measurements including at least one of: at least one measurement performed when the intensity of the light received by photodetector has a known value and at least one measurement performed when the variable measured by the photometer has a known value; and determining the relationship based on the known value(s) and a signal amplitude of the noise reduced signal provided by the signal processing device during the respective calibration measurement.

BRIEF DESCRIPTION OF THE DRAWINGS

The described embodiments and other features, advantages and disclosures contained herein, and the manner of attaining them, will become apparent and the present disclosure will be better understood by reference to the following description of various embodiments of the present disclosure taken in junction with the accompanying drawings, wherein.

DETAILED DESCRIPTION

Figure 1:
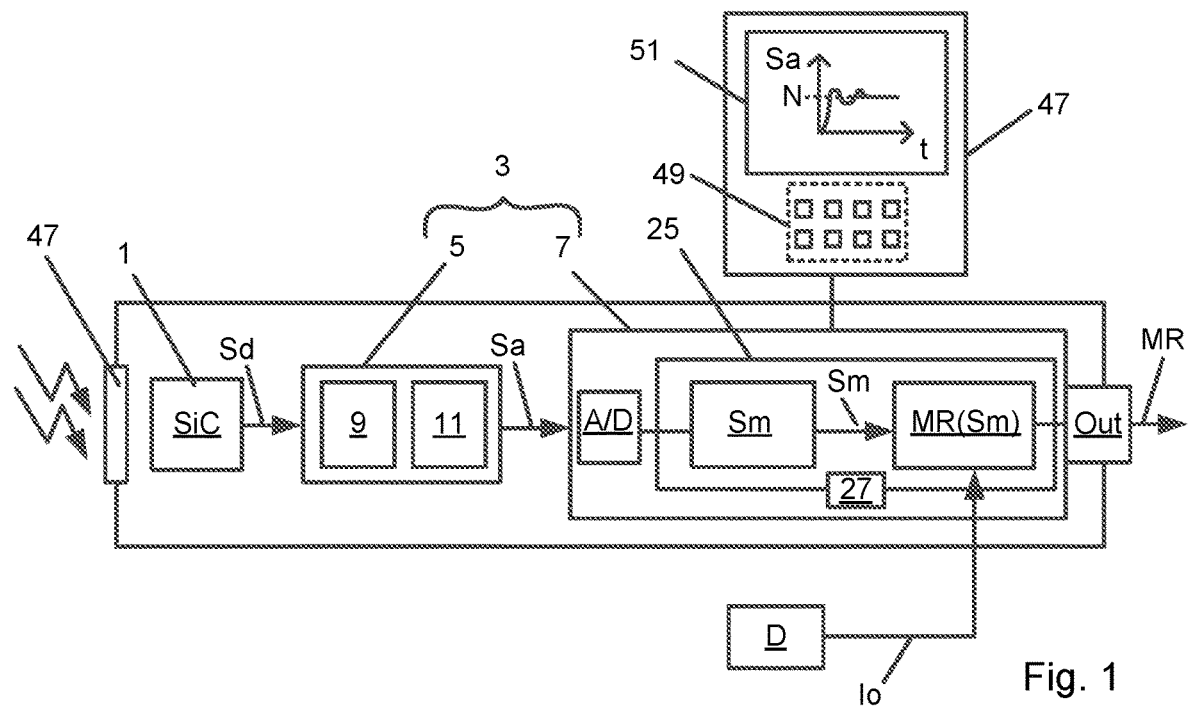
FIG. 1 shows a photometer of the present disclosure.

The present disclosure includes a photometer including a photodetector 1 and measurement electronics 3 connected to the photodetector 1. An exemplary embodiment is shown in FIG. 1. The photodetector 1 is configured to provide a detector signal Sd corresponding to an intensity I of the light received by the photodetector 1. The measurement electronics 3 includes an amplifier 5 connected to the photodetector 1 and a signal processing device 7 connected to the amplifier 5. The signal processing device 7 is configured to determine and to provide a measurement result MR corresponding to the intensity I of the light received by the photodetector 1 based on a measurement signal Sm determined by the signal processing device 7 as or based on an amplified detector signal Sa provided to the signal processing device 7 by the amplifier 5.

Further, at least one of: the amplifier 5 and the signal processing device 7 is configured such that the measurement signal Sm employed to determine the measurement result MR has a high signal-to-noise ratio.

With respect to the amplifier 5, the high signal-to-noise ratio is accomplished by the amplifier 5 being a multistage amplifier including a transimpedance converter 9 connected to the photodetector 1 and configured to convert the detector signal Sd into a corresponding voltage U and a voltage-to-current amplifier 11 connected to the transimpedance converter 9. In this case, the signal processing device 7 determines the measurement signal Sm as or based on the amplified detector signal Sa provided by the voltage-to-current amplifier 11.

Figure 2:
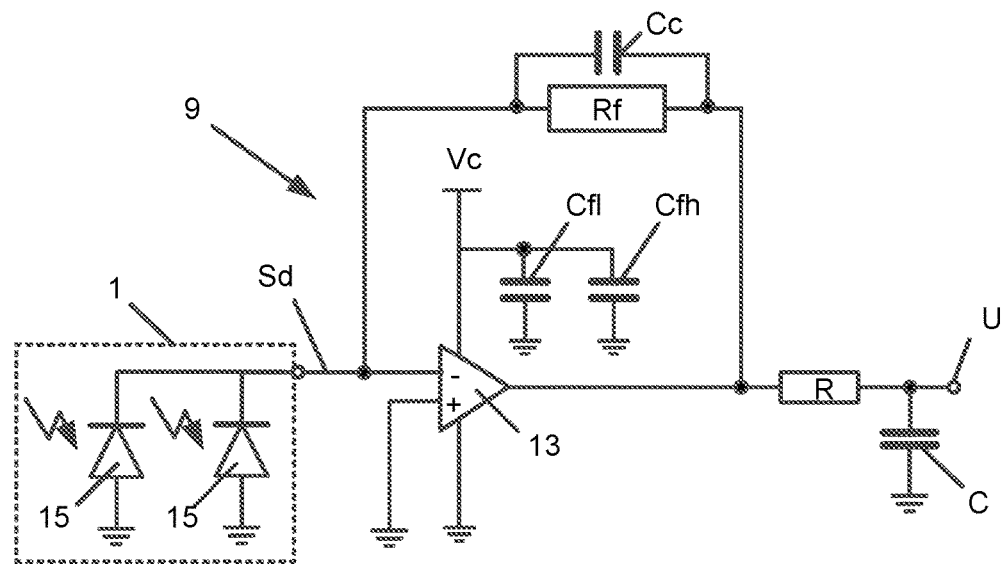
FIG. 2 shows a transimpedance converter.

An exemplary embodiment of the transimpedance converter 9 is shown in FIG. 2. This transimpedance converter 9 includes an operational amplifier 13 having an inverting input connected to an output of the photodetector 1 providing the detector signal Sd and a non-inverting input connected to a reference potential, e.g. ground.

In FIG. 2, the photodetector 1 includes detector elements 15 connected in parallel such that each detector element 15 is connected between the reference potential and the inverting input of the operational amplifier 13. Thus, the detector signal Sd provided by the photodetector 1 is here given by a sum of the currents provided by each one of the detector elements 15.

The transimpedance converter 9 further includes a feedback loop connecting an output of the operational amplifier 13 to the inverting input of the operational amplifier 13 and a feedback resistor Rf disposed in the feedback loop. In consequence, a gain of the transimpedance converter 9 is essentially proportional to the size of the feedback resistor Rf.

In certain embodiments, the transimpedance converter 9 may additionally include a resistance-capacitance element connected in series to the output of the operational amplifier 13. In FIG. 2 the resistance-capacitance element includes a resistor R connected in series to the output of the operational amplifier 13 and a capacitor C connecting the resistor R to the reference potential. The resistance-capacitance element provides the advantage that it smoothens the voltage U provided by the transimpedance converter 9.

The present disclosure is not limited to the transimpedance converter 9 shown in FIG. 2. As an alternative another transimpedance converter, e.g. a high precision and/or a low noise transimpedance converter, can be employed.

Regardless of the type of transimpedance converter employed, the transimpedance converter 9 provides the advantage that it essentially isolates the photodetector 1 from the output of the transimpedance converter 9. Correspondingly, the transimpedance converter 9 constitutes a low impedance load for the photodetector 1. This reduces a leakage current drawn by the amplifier 5, which in turn reduces a current error at the input of the measurement electronics 3.

Figure 3:
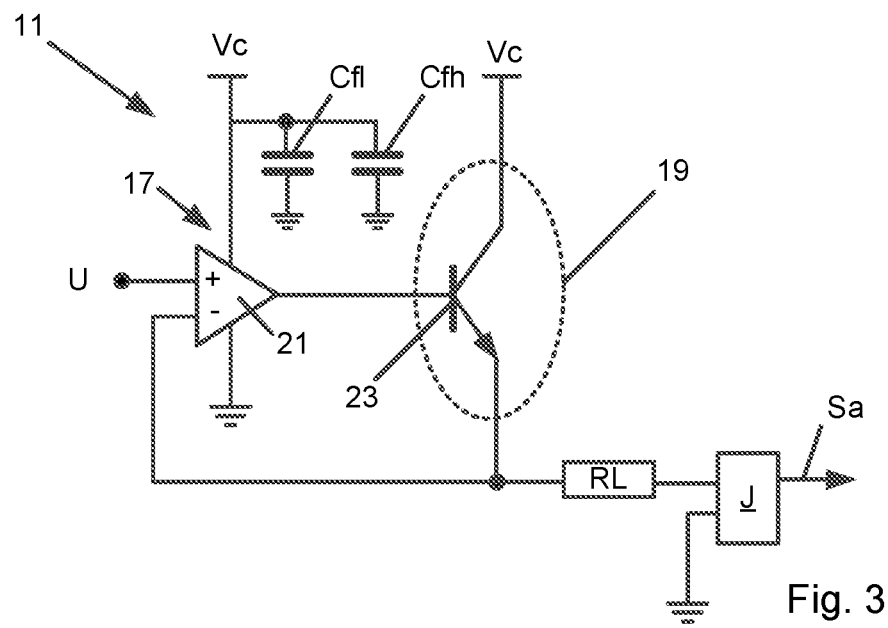
FIG. 3 shows a voltage-to-current amplifier.

An output of the transimpedance converter 9 providing the voltage U is connected to an input of the voltage-to-current amplifier 11. An exemplary embodiment of the voltage-to-current amplifier 11 is shown in FIG. 3. This voltage-to-current amplifier 11 includes a converter 17 and an electronically controllable current source 19. The converter 17 includes an operational amplifier 21 configured to provide a control signal corresponding to the voltage U provided by the transimpedance converter 9 to a control port of the electronically controllable current source 19. To this extent, a non-inverting input of the operational amplifier 21 is connected to the output of the transimpedance converter 9. The electronically controllable current source 19 is configured to provide a current corresponding to the control signal and is connected to an output of the voltage-to-current amplifier 11 providing the amplified detector signal Sa via a gain limiting resistor RL.

In the exemplary embodiment shown, the electronically controllable current source 19 includes a transistor 23 connected up such that a current through the transistor 23 is controlled by the control signal provided by an output of the operational amplifier 21 connected to the control port of the electronically controllable current source 19, here given by the base of the transistor 23. In the exemplary embodiment shown, a collector of the transistor 23 is connected to a supply voltage Vc powering the electronically controllable current source 19 and an emitter of the transistor 23 is connected to an inverting port of the operational amplifier 21. In addition, the emitter of the transistor 23 providing the current is connected to the output of the voltage-to-current amplifier 11 and the gain limiting resistor RL is disposed between the emitter and the output of the voltage-to-current amplifier 11.

In an embodiment, the output of the voltage-to-current amplifier 11 may e.g. include a connector J configured to connect the multistage amplifier to the signal processing device 7.

The present disclosure is not limited to the voltage-to-current amplifier 11 shown in FIG. 3. As an alternative another voltage-to-current amplifier, e.g. a high precision and/or a low-noise voltage-to-current amplifier, can be employed instead.

Regardless of the type voltage-to-current amplifier employed, the voltage-to-current amplifier 11 provides the advantage that it does not include a feedback resistor which would cause a considerable amount of noise corresponding to the size of the feedback resistor.

Due to the electronically controllable current source 19 being powered by the supply voltage Vc, a gain of the voltage-to-current amplifier 11 is essentially only limited by the supply voltage Vc divided by a sum of an internal resistance of the electronically controllable current source 19, e.g. the internal resistance of the transistor 23 and a resistance of the gain limiting resistor RL. Whereas increasing the gain of the transimpedance converter 9 would require increasing the size of the feedback resistor Rf, increasing the gain of the voltage-to-current converter amplifier 11 is accomplished by reducing the size of the gain limiting resistor RL. This provides the advantage that an increase of the gain of the voltage-to-current amplifier 11 is associated with a decrease of the noise caused by the voltage-to-current amplifier 11. As a result, the gain of the multistage amplifier given by a product of the gain of the transimpedance converter 9 and the gain of the voltage-to-current amplifier 11 can be increased by increasing the gain of the voltage-to-current amplifier 11 without a causing a correspondingly high increase of the amplifier noise of the multistage amplifier. Because the gain of the transimpedance converter 9 and the gain of the voltage-to-current amplifier 11 can be predetermined independently of each other, a high gain of the multistage amplifier is e.g. attained with the transimpedance converter 9 having a low gain. The latter provides the advantage of the transimpedance converter 9 having a correspondingly low noise.

In certain embodiments, at least one of the transimpedance converter 9 and the voltage-to-current converter 11 e.g. includes at least one filter Cfl, Cfh connected to a supply line connecting the operational amplifier 13, 21 to a supply voltage Vc powering the operational amplifier 13, 21. In FIGS. 2 and 3 the filters Cfl, Cfh include a low pass filter Cfl and a high pass filter Cfh. Each filter Cfl, Cfh is e.g. given by a capacitor having a capacity of corresponding size inserted in a line connecting the supply line to the reference potential. Each filter Cfl, Cfh provides the advantage that it filters out noise that would otherwise be included in the signal provided by the operational amplifier 13, 21.

With respect to the signal processing device 7, a high signal-to-noise ratio of the measurement signal Sm is e.g. attained by the signal processing device 7 being configured to determine the measurement signal Sm in form of a noise reduced signal Sn determined by subtracting a previously determined noise offset N from the amplified detector signal Sa. Regardless of whether the amplifier 5 is the multistage amplifier described above or another type of amplifier, in these embodiments the measurement result MR is determined by the signal processing device 7 based on the measurement signal Sm given by the noise-reduced signal Sn determined by the signal processing device 7. Thus, the measurement signal Sm is given by: Sm:=Sn, wherein the noise reduced signal Sn is given by: Sn:=Sa−N.

The noise offset N is e.g. given by an offset previously determined based on the amplified detector signal Sa provided by the amplifier 5 when the photodetector 1 is exposed to predefined reference conditions, wherein an intensity I of the light received by the photodetector 1 is essentially equal to a constant intensity Iref smaller or equal to a lower limit Imin of an intensity measurement range IR:=[Imin; Imax] of the photometer.

Corresponding reference conditions are e.g. attained by covering the photodetector 1. In this case, the constant intensity Iref is essentially zero. As an alternative corresponding reference conditions are e.g. attained by turning off a light source providing the light received by the photodetector 1 during measurement operation. In this case, the constant intensity Iref corresponds to an intensity of ambient light entering the photodetector 1, which is at least approximately constant and significantly smaller then intensities of light received by the photodetector 1 when the light source is turned on.

During exposure of the photodetector 1 to the reference conditions, a signal amplitude of the amplified detector signal Sa constitutes a quantitative measure for a noise level consisting of or including an amplified detector noise corresponding to a detector noise of the photodetector 1 amplified by the amplifier 5 and an additional amplifier noise caused by the amplifier 5. Correspondingly, the determination of the noise offset N is e.g. performed by recording the amplified detector signal Sa provided by the amplifier 5 during exposure of the photodetector 1 to the reference conditions, and by determining the noise offset N as an offset given by or corresponding to a signal amplitude of the previously recorded amplified detector signal Sa.

The subtraction of the noise offset N essentially eliminates any DC noise included in the amplified detector signal Sa. The thus accomplished significant improvement of the signal-to-noise ratio of the measurement signal Sm results in a correspondingly higher measurement accuracy of the photometer. In addition, it enables for a higher gain of the amplifier 5 to be applied, which in turn increases the measurement resolution of the photometer.

In certain embodiments, the signal processing device 7 e.g. includes an analog-to-digital converter A/D digitizing the amplified detector signal Sa and further includes a processor 25, e.g. a microprocessor, a microcontroller or a central processing unit, connected to the analog-to-digital converter A/D. As an example, the analog-to-digital converter A/D is e.g. an 18 bit or higher converter, when a signal range of the amplified detector signal Sa corresponding to an amplified current range of 0.1 nA to 10,000 nA is to be covered. As an alternative, a 16 bit converter is sufficient to cover a signal range of 1 nA to 10,000 nA. The processor 25 is e.g. configured to determine the noise-reduced signal Sn by executing a computer program installed on the processor 25 and/or provided in a memory 27 associated to the processor 25. In these embodiments, the noise offset N is e.g. provided to the processor 25 in form of a noise offset value stored in the memory 27.

Depending on whether the amplifier 5 is embodied in form of the multistage amplifier and/or the signal processing device 7 is configured to subtract the noise offset N, the measurement signal Sm employed to determine the measurement result MR is e.g. either given by the amplified detector signal Sa provided by the multistage amplifier or given by the noise reduced signal Sn determined by the signal processing device 7 based on the amplified detector signal Sa regardless of the type of amplifier employed. In either case, the signal processing device 7 is configured to determine the measurement result MR corresponding to the intensity I of the light received by the photodetector 1 based on the measurement signal Sm and to provide the measurement result MR via an output Out of the photometer connected to the signal processing device 7.

The measurement result MR e.g. includes measured values of at least one variable measured by the photometer, e.g. at least one of: a variable given by an intensity I of the light received by the photodetector 1, a variable given by an intensity ratio r corresponding to a quotient I/Io of the intensity I of the light received by the photodetector 1 and a reference intensity Io, and at least one other variable determinable based on the intensity I and/or the intensity ratio r.

The measured values are e.g. determined by the signal processing device 7, e.g. by the processor 25, based on a previously determined relationship between a signal amplitude of the measurement signal Sm and the measurement values of the respective variable. The predetermined relationship is e.g. provided in form of a look up table, a function, a relation or another type of relationship determined by calibration measurements performed with the photometer and/or stored in the memory 27 of the photometer.

Depending on the embodiment of the photometer and/or the measurement application, the reference intensity Io is e.g. a predetermined reference intensity, e.g. a reference intensity stored in the memory 27, or a reference intensity measured and provided to the signal processing device 7 by another device D, e.g. a reference detector included in or connected to the photometer.

The photometer of the present disclosure provides at least the advantages mentioned above. Individual components of the photometer can be implemented in different ways without deviating from the scope of the present disclosure.

As an example, the photodetector 1 is e.g. a detector including at least one charge-coupled device, at least one photodiode, a silicon based photodetector, a silicon carbide based photodetector, a photomultiplier tube or another type of photodetector configured to provide the detector signal Sd corresponding to the intensity I of light received by the photodetector 1. Examples include silicon carbide photodetectors exhibiting a spectral sensitivity to wavelengths larger or equal to 205 nm, Cs—Te photocathode photomultipliers exhibiting a spectral sensitivity to wavelengths larger or equal to 160 nm and Cs—I photocathode photomultipliers exhibiting a spectral sensitivity in a wavelength range of 115 nm to 200 nm.

In certain embodiments, the photodetector 1 is e.g. a silicon carbide photodetector SiC. To this extent, conventional silicon carbide photodetectors and/or detectors including at least one silicon carbide based detector element can be employed. Silicon carbide photodetectors commonly include a die including an array of p-n junctions, each converting incident photons into current. Depending on the type of silicon carbide photodetector and/or a size of a die area of the die, silicon carbide photodetectors provide detector signals Sd in an output range of 3 nA to 15 nA. Silicon carbide photodetectors SiC provide the advantage that the detector noise, e.g. a dark current, included in the detector signal Sd is extremely small, e.g. of the order of femtoamperes.

In at least one embodiment, the amplifier 5 is e.g. an amplifier having an adjustable gain. In this case, an intensity range IR of intensities I measurable with the photometer can be adjusted by adjusting the gain. This provides the advantage that the same photometer can be applied to perform accurate measurements in different intensity ranges IR.

When the amplifier 5 includes the transimpedance converter 9 and the voltage to current amplifier 11, the adjustable gain of the amplifier 5 is attained by at least one of the transimpedance converter 9 and the voltage to current amplifier 11 having an adjustable gain.

Figure 4:
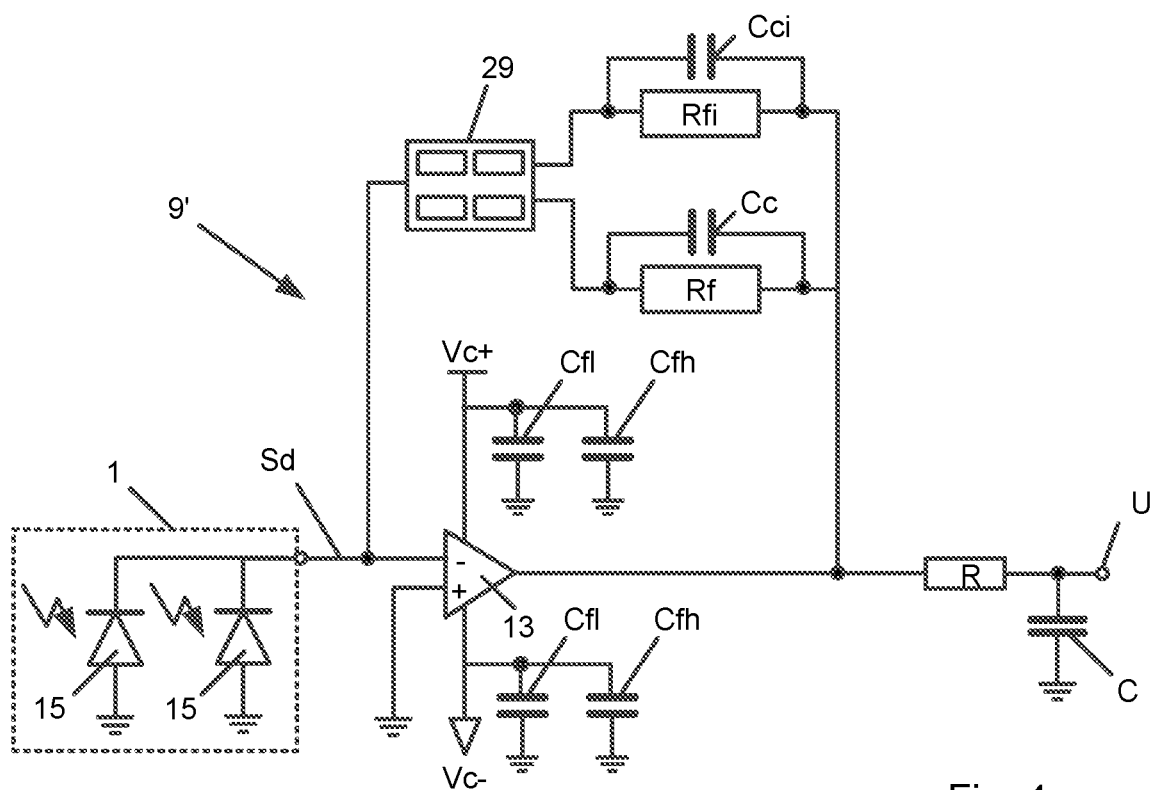
FIG. 4 shows a transimpedance converter having an adjustable gain.

An exemplary embodiment of a transimpedance converter 9' having an adjustable gain is shown in FIG. 4. This transimpedance converter 9' is a modification of the transimpedance converter 9 shown in FIG. 2, wherein the feedback loop has been modified to additionally include at least one additional line segment, each connected in parallel to a line segment of the feedback loop including the feedback resistor Rf. Each of these line segments has a first end connected to a first end section of the feedback loop and a second end connected to a switch 29, e.g. a dip switch, connected to a second end of the feedback loop. In FIG. 4, the first end section of the feedback loop is connected to the output of the operational amplifier 13 and the second end section of the feedback loop connects the switch 29 to the inverting input of the operational amplifier 13. Each of the line segments includes a feedback resistor Rf, Rfi of a different size. The switch 29 is configured to be operated in a number of different switch settings corresponding to the number of line segments connected to the switch 29. In each switch setting a different one of the line segments is connected to the second end of the feedback loop. Correspondingly the gain of the transimpedance converter 9' is adjustable to a number of different gain settings, each corresponding to the size of the feedback resistor Rf, Rfi included in the line segment connected to the second end of the feedback loop by the switch 29 in the corresponding switch setting.

Regardless of whether the gain of the transimpedance converter 9, 9' is adjustable or not, the transimpedance converter 9, 9' may e.g. include a compensation capacitor Cc, Cci for each feedback resistor Rf, Rfi that is connected in parallel to the respective feedback resistor Rf, Rfi. Each compensation capacitor Cc, Cci is e.g. dimensioned such that its capacity is sufficiently large to suppress oscillations that might otherwise occur due to an internal capacitance of the photodetector 1 and an internal capacitance operational amplifier 13 of the transimpedance converter 9, 9' and small enough to avoid an unnecessary reduction of a bandwidth of the transimpedance converter 9'.

Figure 5:
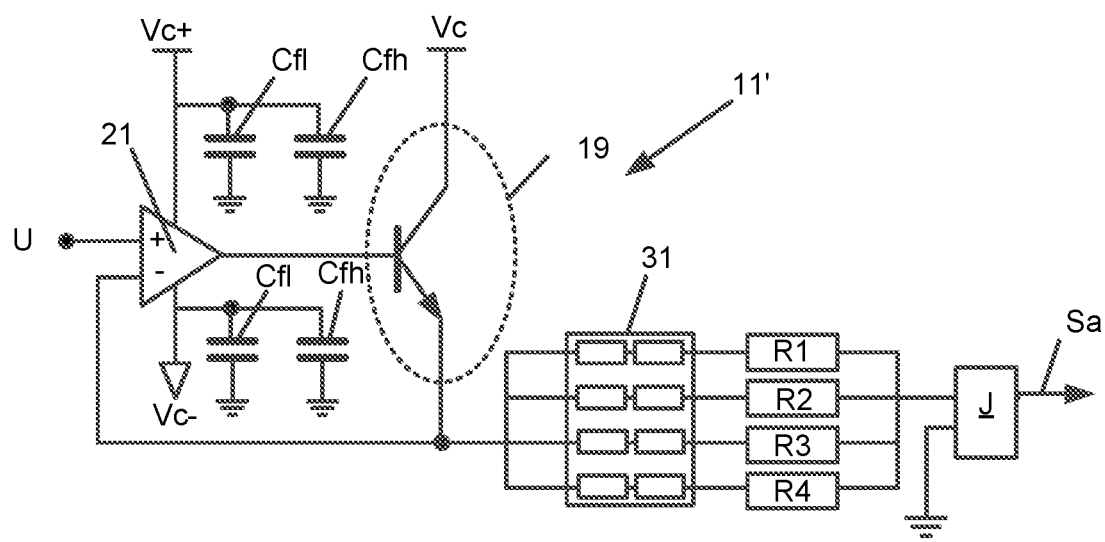
FIG. 5 shows a voltage-to-current amplifier having an adjustable gain.

An exemplary embodiment of a voltage-to-current amplifier 11' having an adjustable gain is shown in FIG. 5. This voltage-to-current amplifier 11' is a modification of the voltage-to-current amplifier 11 shown in FIG. 2, wherein the gain limiting resistor RL shown in FIG. 2 has been replaced by a switch 31, e.g. a dip switch, connected to a set of parallel lines, wherein each line includes a gain limiting resistor R1, R2, R3, R4 of a different size. The switch 31 is configured to be operated in a number of different switch settings such that in each switch setting the output of the electronically controllable current source 19 is connected to the output of the voltage to current amplifier 11' via a different one of the parallel lines including one of the gain limiting resistors R1, R2, R3, R4. Correspondingly, the gain of this voltage-to-current amplifier 11' is adjustable to a number of different gain settings, each corresponding to the size of the gain limiting resistor R1, R2, R3 or R4 included in the line connecting the output of the electronically controllable current source 19 to the output of the voltage to current amplifier 11' in the respective switch setting.

Regardless of whether the gain of the transimpedance converter 9, 9' and/or the gain of the voltage-to-current amplifier 11, 11' is adjustable or not, the gain of the voltage-to-current amplifier 11, 11' is larger than the gain of the transimpedance converter 9, 9', e.g. as much as an order of magnitude larger than the gain of the transimpedance converter 9, 9'.

In certain embodiments, the transimpedance converter 9, 9' is e.g. configured to have a fixed or adjustable gain smaller or equal to 20, e.g. a gain of 5 to 20, and the voltage-to-current amplifier 11, 11' is e.g. configured to have a fixed or adjustable gain larger or equal to 100, e.g. a gain of 100 to 800. This provides the advantage of a high gain of the multistage amplifier in combination with a low amplifier noise of the multistage amplifier.

Regardless of the type of the amplifier 5 applied, the amplifier 5 is e.g. configured as a single polarity power supply amplifier. This is e.g. attained by connecting each operational amplifier of the amplifier 5 up such that its first power supply terminal is connected to a supply voltage Vc and its second power supply terminal is connected to a reference potential, e.g. ground. This is illustrated in FIGS. 2 and 3, where the operational amplifiers 13 and 21 are connected between the supply voltage Vc and the reference potential, and can be applied in the same way when the amplifier 5 is of a different type, e.g. of the type shown in FIGS. 4 and 5.

As an alternative, the amplifier 5 is e.g. configured as a dual polarity power supply amplifier. This is e.g. attained by connecting each operational amplifier of the amplifier 5 up such that its first power supply terminal is connected to a positive supply voltage Vc+ and its second power supply terminal is connected to a negative supply voltage Vc−. This is illustrated in FIGS. 4 and 5, where the operational amplifiers 13 and 21 are connected between the positive supply voltage Vc+ and the negative supply voltage Vc− and can be applied in the same way when the amplifier 5 is of a different type, e.g. of the type shown in FIGS. 2 and 3.

As an example the positive and the negative supply voltage Vc+, Vc− are e.g. provided by an electronic circuit including a DC-DC converter connected to a power supply and configured to provide a positive and a negative output voltage. Each of the two output voltages is then supplied to a corresponding voltage regulator providing the corresponding positive or negative supply voltage Vc+, Vc−. In certain embodiments, at least one filter, e.g. a low pass filter Cfl and/or a high pass filter Cfh may be connected to at least one or each of the lines connecting the second power supply terminal of one of the operational amplifiers 13, 21 to the negative supply voltage Vc−.

The amplifier 5 being a dual polarity power supply amplifier provides the advantage that a DC-noise offset included in the detector signal Sd can be compensated based on the negative voltage Vc−. In addition, the dual polarity power supply amplifier exhibits a higher sensitivity with respect to low incoming detector signals Sd, and it increases the dynamic measurement range. Thus, the amplifier 5 being a dual polarity power supply amplifier is particularly advantageous when the noise, e.g. the dark current, included in the detector signal Sd is comparatively large due to the type of photodetector 1 applied.

In combination with the amplifier 5 having the adjustable gain, the signal processing device 7 is e.g. configured to determine the noise reduced signal Sn based on a gain setting Gij of the amplifier gain applied during the respective photometric measurement and the corresponding noise offset N given by a previously determined gain-specific noise offset Nij. Each gain-specific noise offset Nij is e.g. determined as described above by exposing the photodetector 1 to the reference conditions while the amplifier 5 is operated in the respective amplifier gain setting Gij.

In certain embodiments, the photometer is e.g. a measurement instrument measuring at least one variable corresponding to the intensity I of the light received by the photodetector 1, e.g. the intensity I, the intensity ratio r corresponding to the intensity I of the light received by the photodetector 1 divided by the reference intensity Io and/or at least one variable determinable based on the intensity I and/or the intensity ratio r.

In other embodiments, the photometer is e.g. a photometric sensor measuring at least one variable of a medium. In this case, the photometer is e.g. embodied as a fluorescence sensor measuring a variable given by or corresponding to on the intensity I of fluorescent light emitted towards the photodetector 1 by the medium, as a turbidity sensor measuring a turbidity of the medium, e.g. a turbidity sensor measuring turbidity based on the intensity of light scattered towards the photodetector 1 by the medium, as an absorption sensor measuring absorption A based on the intensity ratio r corresponding to the intensity I of light transmitted to the photodetector 1 through the medium divided by the reference intensity Io and/or as a concentration sensor measuring a concentration C of an analyte contained in the medium based on the intensity ratio r corresponding to the intensity I of light transmitted to the photodetector 1 through the medium divided by the reference intensity Io. In either case, the measurement result MR provided by the photometer includes measured values of the respective variable determined by the photometer.

Figure 6:
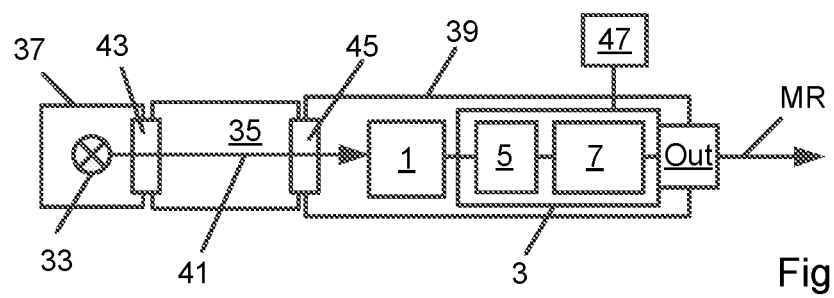
FIG. 6 shows a photometer for measuring a variable of a medium.

An exemplary embodiment of a photometer embodied as a photometric sensor is shown in FIG. 6. This photometric sensor is a modification of the photometer shown in FIG. 1 additionally including a light source 33, e.g. an ultraviolet bulb, a light emitting diode, a laser diode or another type of light source, providing light having a frequency or a frequency range detectable by the photodetector 1. The light source 33 is configured to transmit light to or through a measurement region 35 configured to accommodate the medium or a sample of the medium and the photodetector 1 is configured to receive light from the measurement region 35.

The photometric sensor is e.g. embodied as an immersion probe. In this case, the measurement region 35 is e.g. a chamber or recess configured to be filled with the medium when the photometer is immersed in the medium. As an alternative, the photometric sensor is e.g. embodied as an in-line sensor. In this case, the measurement region 35 is e.g. given by an interior of a measurement cell or by an interior of a flow cell, and the medium or a sample of the medium is supplied to the measurement region 35, e.g. supplied to the interior of the measurement cell or routed through the flow cell.

In the example shown, the light source 33 and the photodetector 1 are each enclosed in a housing 37, 39 and the light source 33 transmits light along a optical path 41 extending through a first transparent window 43, through the measurement region 35 and through a second transparent window 45 to the photodetector 1.

In the exemplary embodiment shown in FIG. 6, the light source 33 and the photodetector 1 are disposed on opposite sides of the measurement region 35. As an alternative, particularly suitable when the photodetector 1 is to receive light scattered by the medium or fluorescent light emitted by the medium, the light source and the photodetector may be disposed next to each other on a front side of the photometric sensor adjoining a measurement region.

Figure 7:
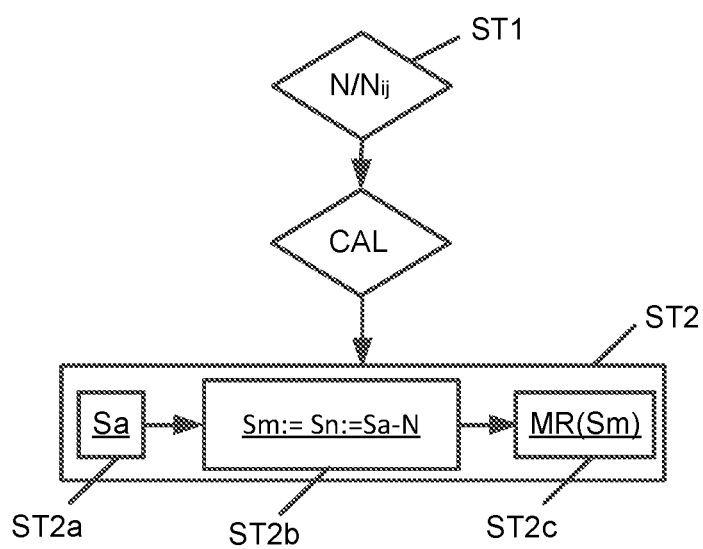
FIG. 7 shows a method of performing photometric measurements.

The present disclosure further includes a method of performing at least one photometric measurement with the photometer including the signal processing device 7 configured to determine the measurement signal Sm in form of the noise reduced signal Sn. As illustrated in the flow chart shown in FIG. 7 the method includes a first step ST1 of determining at least one noise offset N, Nij and a second step ST2 of at least once performing a photometric measurement with the photometer.

The determination of each noise offset N, Nij is e.g. performed as described above by exposing the photodetector 1 to the reference conditions, e.g. by covering the photodetector 1 or by turning of the light source 33. Next, the amplified detector signal Sa provided by the amplifier 5 at a time when or during a time period wherein the photodetector 1 is exposed to the reference conditions is recorded. Subsequently, the respective noise offset N, Nij is determined as or based on a signal amplitude of the previously recorded amplified detector signal Sa. In certain embodiments, the thus determined noise offset N, Nij is e.g. stored in form of a corresponding noise offset value in the memory 27 of the photometer.

In at least one embodiment, the photometer is e.g. configured to be operated in at least two different operation modes including a set up mode and a measurement mode. In this case the respective operation mode is e.g. selectable via an interface 47 of the photometer.

The interface 47 is e.g. a user interface and/or a communication interface. In the exemplary embodiment shown in FIG. 1, the interface 47 includes operating elements 49, such as keys, dials, switches or other input devices, and/or a display 51. In certain embodiments, the gain setting Gij of the adjustable gain of the amplifier 5 is selectable via the interface 47, e.g. during the set up mode. As another example, the operating elements 49 e.g. include at least one element, e.g. at least one of the switches 29, 31 described above, configured to enable adjusting the gain setting Gij.

In at least one embodiment, the photometer is e.g. configured to perform the first step ST1 in a semi-automated manner. In this case, the photometer is e.g. transferred into the set up mode by a corresponding command provided via the interface 47, and configured to perform the determination of the at least one noise offset N, Nij based on the amplified detector signal Sa recorded by the photometer after receipt of a start command indicating that the photodetector 1 is exposed to the reference conditions.

In certain embodiments, the photometer is e.g. configured to display the amplified detector signal Sa as shown in FIG. 1 following receipt of the start command and to determine the respective noise offset N, Nij based on the amplified detector signal Sa recorded by the photometer following receipt of a second start signal provided by the user once the displayed amplified detector Sa has stabilized.

When the gain of the amplifier 5 is a predetermined or fixed amplifier gain, the first step ST1 includes determining the noise offset N for this amplifier gain. When the gain of the amplifier 5 is adjustable the first step ST1 e.g. includes determining the gain-specific noise offset Nij for at least one, at least two, or each one of the different amplifier gain settings Gij.

During the second step ST2 the photodetector 1 is exposed to measurement conditions, wherein the intensity of the light received by the photodetector 1 corresponds to the variable to be measured. Each photometric measurement includes method step ST2a of amplifying the detector signal Sd provided by the photodetector 1, method step ST2b of based on the amplified detector signal Sa determining the measurement signal Sm in form of the noise-reduced signal Sn by subtracting the previously determined noise offset N, Nij from the amplified detector signal Sa and method step ST2c of determining the measurement result MR corresponding to the variable measured based on the thus determined measurement signal Sm.

As described above, the measurement result MR is e.g. determined based on the predetermined relationship between the signal amplitude Sm(I) of the measurement signal Sm and the corresponding measurement values of the variable measured. In this respect, the method e.g. includes a method step CAL of determining the relationship based on calibration data determined by performing a calibration. To this extent conventional calibration methods, e.g. methods including two or more successively performed calibration measurements during which the intensity I of the light received by photodetector 1 has a known value and/or during which the variable measured by the photometer has a known value, can be performed. In difference to conventional calibration methods, where the relationship is determined based on the amplified detector signal Sa, the determination of the relationship is here performed based on the measurement signal Sm given by the noise-reduced signal Sn determined by the signal processing device 7 during the respective calibration measurement. Correspondingly, the method step CAL of determining the relationship is performed after the first method step ST1 and before the second method step ST2.

Regardless of how the relationship is determined, the determination of the measurement result MR is e.g. performed by determining the measured values of the variable measured by the photometer as a function of the intensity dependent signal amplitude Sm(I) of the measurement signal Sm given by the noise reduce signal Sn.

As an example, intensity measurement values Im of the intensity I measured by the photometer are e.g. determined as a linear function of the signal amplitude Sm(I) of the measurement signal Sm, e.g. a function given by: Im:=k1*Sm(I)+k2, wherein k1 and k2 denominate coefficients of the function determined based on the calibration data. Correspondingly, ratio measurement values $r_m$ of the ratio r measured by the photometer are e.g. determined based on a quotient of the intensity measurement values Im divided by the reference intensity Io.

Absorption measurement values Am of the absorption of the medium measured by the photometer are e.g. determined as a logarithmic function of the signal amplitude Sm(I), e.g. a function given by:

$$Am := -Ao \; \log\left\{\frac{k1*(Sm(I)+k2)}{k3*Io} + k4\right\}$$

wherein Ao, k1, k2, k3 and k4 denominate coefficients of the logarithmic function determined based on the calibration data. Analogously, concentration measurement values Cm of the concentration C of an analyte contained in medium measured by the photometer are e.g. determined as a logarithmic function of the signal amplitude Sm(I), e.g. a function given by:

$$Cm := -Co \; \log\left\{\frac{k1(Sn(I)+k2)}{k5*Io} + k6\right\}$$

wherein Co, k1, k2, k5 and k6 denominate coefficients of the logarithmic function determined based on the calibration data.

Figure 8:
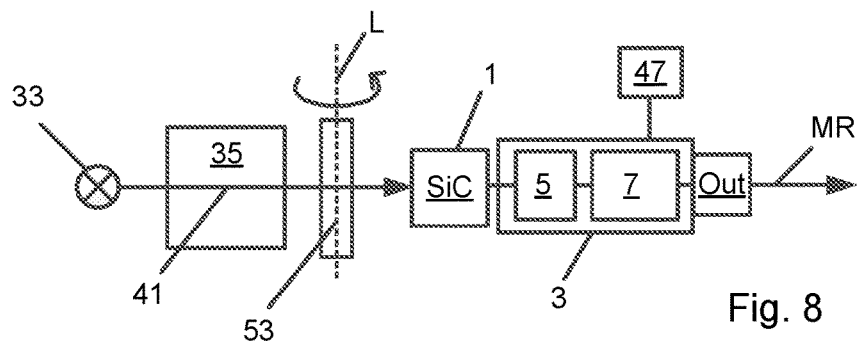
FIG. 8 shows a photometer including a filter.

The present disclosure further includes a photometer for performing photometric measurements in a limited wave length range. An exemplary embodiment is shown in FIG. 8.

Just like the photometer shown in FIG. 6, the photometer includes the light source 33, the photodetector 1, measurement electronics 3 connected to the photodetector 1, and the measurement region 35 configured to accommodate the medium or a sample of the medium, and the light source 33 is configured to transmit light along the optical path 41 extending through the measurement region 35 to the photodetector 1. Regarding the light source 33, the photodetector 1, the measurement electronics 3 and the measurement region 35, the embodiments described above can be used. As an alternative, conventional measurement electronics configured to determine and to provide the measurement result MR based on the detector signal Sd provided by the photodetector 1 can be used instead.

The photometer further includes a filter 53 disposed in the optical path 41 extending from the light source 1 through the measurement region 35 to the photodetector 1. The filter 53 is a rotatably mounted optical band pass filter and is configured such, that a center wave length λC of the filter 53 is adjustable by adjusting an angle of incidence α between the optical path 41 and a normal n to a filter surface of the filter 53 by rotating the filter 53 around an axis of rotation L perpendicular to the optical path 41.

As an example, the filter 53 is e.g. an interference filter. Interference filters operate based on the principle of interference. To this extent, they commonly include a set of layers having different refractive indices. Filter characteristics of interference filters depend on the number, the order, the materials and the thickness of the individual layers.

Figure 9:
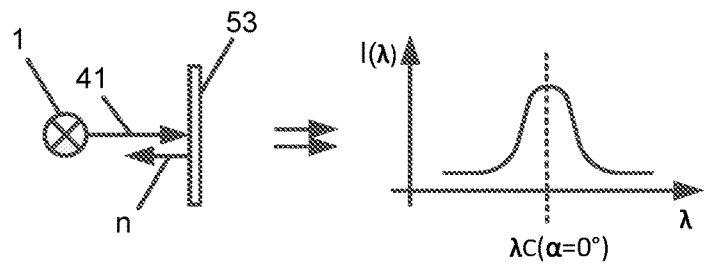
FIG. 9 shows an intensity spectrum of filtered light attained with an angle of incidence of 0°.

Interference filters are commonly installed in a fixed filter position, wherein the normal n on the filter surface receiving the light to be filtered is antiparallel to the optical path 41 along which the light is transmitted to the filter. This filter position of the filter 53 of the photometer shown in FIG. 8 is shown in FIG. 9 together with an example of an intensity spectrum I(λ) of the filtered light exciting the filter 53 positioned in this filter position. In this filter position, the normal n on the filter surface is antiparallel to the optical path 41 and the angle of incidence α is 0°. Due to the filter 53 being a band bass filter, the intensity spectrum I(λ) exhibits a maximum intensity at a wave length λ corresponding to the center wave length λC:=λC(α=0°) of the filter 53 in this filter position.

Figure 10:
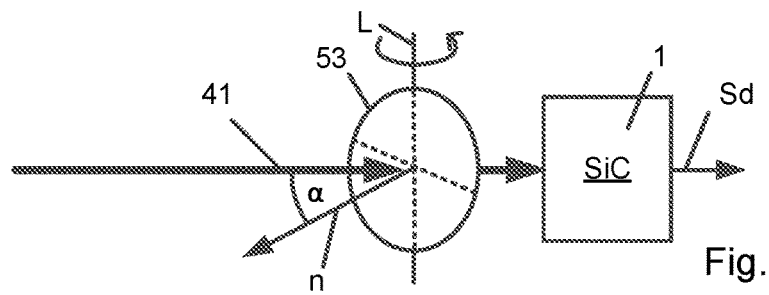
FIG. 10 shows the filter of FIG. 8 in a measurement position, wherein an angle of incidence is larger than 0°.

As shown in FIG. 10, taking an angle of incidence α of 0° as a starting position, rotating the filter 53 around the axis of rotation L by a given angle of rotation causes an increase of the angle of incidence α of corresponding size. With respect to the interferences occurring within the filter 53, the change of the angle of incidence α leads to a corresponding change of the effective lengths of the optical path segments within each of the layers of the interference filter. This leads to a corresponding change of the center wave length λC of the filter 53.

Figure 11:
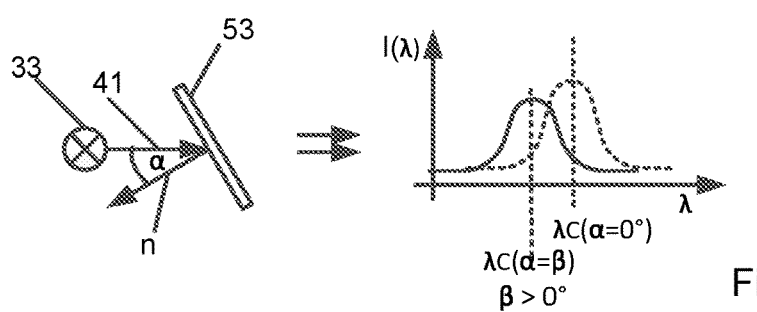
FIG. 11 shows an intensity spectrum of filtered light attained with an angle of incidence larger than 0°.

This is illustrated in FIG. 11, showing the filter 53 in a filter position, wherein the angle of incidence α is equal to an angle β larger than 0° and smaller than 90° together with the corresponding intensity spectrum I(λ) of the filtered light exiting the filter 53 when the filter 53 is in this filter position. In the example shown, increasing the angle of incidence α from α=0° shown in FIG. 9 to α=β shown in FIG. 11 results in a decrease of the center wave λC from λC(α=0°) shown in FIG. 9 to λC(α=β) shown in FIG. 11.

The photometer including the rotatably mounted filter 53 provides the advantage that the center wave length λC of the filter 53 is adjustable within a comparatively wide range of center wave lengths λC and that this range of center wave lengths λC is available, even when the band width of the filter 53 is narrow. This provides the advantage that the same photometer can be used in a correspondingly wide range of applications to perform photometric measurements in a limited wave length range corresponding to the limited or narrow bandwidth of the filter 53.

Provided that a spectral line of interest in a specific application occurs within the range of center wave lengths λC available, the center wave length λC filter 53 can be adjusted to this application specific spectral line by rotating the filter 53 into the corresponding filter position.

In this filter position, the filter 53 exhibits a peak transmittance at the application specific spectral line. This leads to a correspondingly high intensity of the light received by the photodetector 1 with respect to the application specific spectral line, which in turn results in a correspondingly high measurement accuracy and a correspondingly high measurement resolution.

The filter 53 having a narrow band width is particularly advantageous in applications where absorption and/or concentration measurements are performed on a medium including at least two analytes absorbing light at different specific absorption lines. In these applications the peak transmittance of the filter 53 at the application specific spectral line in combination with the narrow band width of the filter 53 provides the advantage that it enables or at least facilitates differentiating between absorption caused by the different analytes.

In photometers including the filter 53, the light source 33 is e.g. a light source providing ultraviolet light, e.g. light having wave lengths of 100 nm to 400 nm and the photodetector 1 is e.g. a silicon carbide detector SiC configured to detect ultra violet light.

In certain embodiments, the filter 53 is rotatably mounted such, that the angle of incidence α is adjustable within an angle range of 0° to 30°. As shown in FIG. 11, an increase of the angle of incidence α is regularly associated with a reduction of a peak transmittivity of the filter 53 at the corresponding center wave length λC(α). Thus, limiting the angle of incidence α to angles larger or equal to 0° and smaller or equal to 30° provides the advantage that a comparatively high peak transmittivity of the filter 53 is ensured within the entire range of center wave lengths λC corresponding to the range of angles of incidence α.

To give a more specific example, the filter 53 is e.g. a filter having a center wave length λC of 280 nm and a band width of 10 nm given by: 280 nm+/−5 nm at an angle of incidence α of 0°. In this case, the center wave length λC of this filter 53 is e.g. reduced by up to 10 nm or even up to 12 nm by increasing the angle of incidence α to 30°. As demonstrated based on this example, the range of center wave length λC available is of considerable size, even when the band width of the filter 53 is narrow.

In certain embodiments, the measurement electronics 3 includes the amplifier 5 having the adjustable gain. This provides the advantage that the reduction of a peak transmittivity of the filter 53 associated with increasing the angle of incidence α can be compensated by increasing the gain of the amplifier 5 accordingly.

Figure 12:
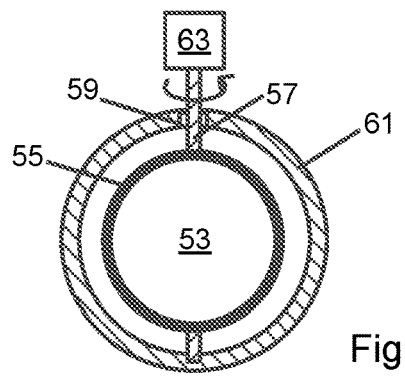
FIG. 12 shows a housing accommodating the filter shown in FIG. 8.

Various different ways of mounting the filter 53 such that it can be rotated around the axis of rotation L perpendicular to the optical path 41 can be used. As an example, shown in FIG. 12 the filter 53 is e.g. set in a frame 55 mounted onto a support 57 extending though an opening 59 of a housing 61 accommodating the filter 53. As an alternative, in case the filter 53 is sufficiently rigid, the filter 53 is e.g. mounted directly onto the support 57. In either case the support 57 is rotatably secured on the housing 61 and the housing 61 is configured and positioned such that the optical path 41 extending through the housing 61 extends through a center section of the filter 53. As shown, the housing 61 is e.g. an essentially cylindrical housing positioned such that the optical path 41 extends in parallel to a longitudinal axis of the housing 61 through a center section of the filter 53.

In certain embodiments, the photometer may include an adjuster 63 configured to enable and/or to perform adjustments of the center wave length λC by rotating the filter 53 into the corresponding measurement position. As an example, the adjuster 63 e.g. includes a dial, a knob or another device enabling manual adjustment, and/or an actuator, e.g. a stepper motor, configured to rotate the filter 53 into the corresponding measurement position based on a control command provided to the actuator, e.g. via the interface 47 of the photometer.

The invention claimed is:

1. A photometer, comprising:
   a photodetector configured to provide a detector signal corresponding to an intensity of light received by the photodetector; and
   measurement electronics including:
      an amplifier connected to the photodetector and configured to provide an amplified detector signal; and
      a signal processing device connected to the amplifier and configured to determine a measurement signal based on the amplified detector signal and to determine and to provide a measurement result corresponding to an intensity of the light received by the photodetector based on the measurement signal determined by the signal processing device,
   wherein the signal processing device is configured to determine the measurement signal:
      a) based on the amplified detector signal provided by the amplifier, wherein the amplifier is a multistage amplifier including a transimpedance converter connected to the photodetector and a voltage-to-current amplifier connected to the transimpedance converter, or
      b) based on a noise-reduced signal determined by subtracting a previously determined noise offset included in the amplified detector signal from the amplified detector signal.

2. The photometer of claim 1, wherein a gain of the voltage-to-current amplifier is larger or an order of a magnitude larger than a gain of the transimpedance converter.

3. The photometer of claim 1, wherein:
   the transimpedance converter has a fixed or adjustable gain smaller or equal to 20 or a fixed or adjustable gain larger gain larger or equal to 5 and smaller or equal to 20; and
   the voltage-to-current amplifier has a fixed or adjustable gain larger or equal to 100 or a fixed or adjustable gain larger or equal to 100 and smaller or equal to 800.

4. The photometer of claim 1, wherein:

the amplifier has an adjustable gain; and the signal processing device is configured to determine the noise-reduced signal based on a gain setting of the amplifier gain applied during a photometric measurement performed with the photometer and the corresponding noise offset given by a gain-specific noise offset previously determined for the respective gain setting.

5. The photometer of claim 1, further comprising at least one of:

a light source;

a measurement region configured to accommodate a medium or a sample of the medium, a measurement region given by a chamber or a recess configured to be filled with medium when the photometer is immersed in the medium or a measurement region given by an interior of a measurement cell or by an interior of a flow cell; and an interface, a communication interface, a user interface or an interface including at least one of: at least one operating element including at least one of: a display and at least one operating element, the at least one operating element including at least one of: at least one switch, at least one key, at least one input device, at least one element configured to enable adjusting a gain setting of a gain of the amplifier, a dip switch configured to enable adjusting a gain setting of again of the transimpedance converter and a dip switch configured to enable adjusting a gain setting of a gain of the voltage to current amplifier.

6. The photometer of claim 1, wherein the photometer is:

a measurement instrument measuring at least one variable corresponding to the intensity of the light received by the photodetector, the at least one variable including at least one of: the intensity of the light received by the photodetector, an intensity ratio corresponding to the intensity of the light received by the photodetector divided by a reference intensity and at least one variable determinable based on at least one of: the intensity and the intensity ratio; or a photometric sensor measuring at least one variable of a medium, a fluorescence sensor measuring a variable given by or corresponding to an intensity of fluorescent light emitted towards the photodetector by the medium, a turbidity sensor measuring a turbidity of the medium, a turbidity sensor measuring turbidity based on the intensity of light scattered towards the photodetector by the medium, an absorption sensor measuring absorption based on an intensity ratio corresponding to the intensity of light transmitted to the photodetector through the medium divided by a reference intensity, or a concentration sensor measuring a concentration of an analyte contained in the medium based on an intensity ratio corresponding to the intensity of light transmitted to the photodetector through the medium divided by a reference intensity, and wherein the measurement result includes at least one of:
measured values of at least one of the at least one variable measured by the photometer; and
measured values of at least one of the at least one variable measured by the photometer determined by the signal processing device based on the measurement signal and a previously determined relationship between a signal amplitude of the measurement signal and the measured values; wherein the measurement signal is either given by the amplified detector signal provided by the multistage amplifier or by the noise reduced signal.

7. The photometer of claim 1, wherein:

the photodetector is or includes at least one charge-coupled device, at least one photodiode, a silicon based photodetector, a silicon carbide based photodetector, a photomultiplier tube or another type of photodetector; and/or the amplifier is either configured as a signal polarity power supply amplifier or as a dual polarity power supply amplifier.

8. The photometer of claim 1, wherein:

the transimpedance converter includes:
an operational amplifier having an inverting input connected to an output of the photodetector and a non-inverting input connected to a reference potential; and
a feedback loop connecting an output of the operational amplifier to the inverting input of the operational amplifier; wherein the feedback loop either includes a feedback resistor disposed in a line segment of the feedback loop or includes: a set of at least two line segments, each having a first end connected to a first end section of the feedback loop and a second end connected to a switch or a to a switch given by a dip switch, and a feedback resistor of a different size disposed in each one of the line segments; wherein the switch connected to each of the line segments is connected to a second end of the feedback loop; and wherein the switch is configured to be operated in a number of different switch settings such, that in each switch setting a different one of the line segments is connected to the second end of the feedback loop; and/or the voltage-to-current amplifier includes a converter and an electronically controllable current source; wherein the converter includes an operational amplifier configured to provide a control signal corresponding to a voltage provided by the transimpedance converter to a control port of the electronically controllable current source; and wherein the electronically controllable current source is configured to provide a current corresponding to the control signal;

wherein the electronically controllable current source is either connected to an output of the voltage-to-current amplifier via gain limiting resistor or via a switch or a switch given by a dipswitch, wherein the switch is connected to a set of lines connected in parallel to each other to the output of the voltage to current amplifier, wherein a gain limiting resistors of a different size is disposed in each one of the lines, and wherein the switch is configured to be operated in a number of different switch settings such that in each switch setting the output of the electronically controllable current source is connected to the output of the voltage to current amplifier via a different one of the gain limiting resistors.

9. The photometer of claim 1, wherein the voltage-to-current amplifier includes:

an operational amplifier having a non-inverting input connected to the output of the transimpedance converter; and a transistor having a collector connected to a supply voltage, a base connected to an output of the operational amplifier and an emitter connected to an inverting port of the operational amplifier and connected to an output of the voltage-to-current amplifier via a gain limiting resistor disposed between the emitter and the output of the voltage to current amplifier.

10. The photometer of claim 8, additionally comprising at least one of:
a compensation capacitor for each feedback resistor of the transimpedance converter, wherein each compensation capacitor is connected in parallel to the respective feedback resistor;
at least one filter or at least one filter including a capacitor, wherein each filter is connected to a supply line connecting the operational amplifier of the transimpedance converter to a supply voltage powering this operational amplifier;
at least one filter or at least one filter including a capacitor, wherein each filter is connected to a supply line connecting the operational amplifier of the voltage to current amplifier to a supply voltage powering this operational amplifier; and
a resistance-capacitance element including a resistor connected in series to the output of the operational amplifier of the transimpedance converter and a capacitor connecting this resistor to a reference potential.

11. The photometer of claim 1, wherein the photometer is configured to:
be operated in at least two different operation modes including a set up mode and a measurement mode, wherein each mode is selectable via an interface of the photometer; and
in the set up mode upon receipt of a start command indicating that the photodetector is exposed to reference conditions determine the noise offset included in the amplified detector signal as or based on a signal amplitude of the amplified detector signal provided by the amplifier while the photodetector is exposed to the reference conditions.

12. The photometer of claim 1, further comprising:
a light source;
a measurement region configured to accommodate the medium or a sample of the medium, a measurement region measurement region given by a chamber or a recess configured to be filled with medium when the photometer is immersed in the medium or a measurement region given by an interior of a measurement cell or by an interior of a flow cell; and
a filter disposed in an optical path extending from the light source through the measurement region to the photodetector;
wherein the filter is a band pass filter rotatably mounted and configured such that a center wavelength of the filter is adjustable by adjusting an angle of incidence between the optical path and a normal to a filter surface of the filter by rotating the filter around an axis of rotation perpendicular to the optical path.

13. The photometer of claim 12, wherein the angle of incidence is adjustable within an angle range of 0° to 30°.

14. The photometer of claim 12, wherein:
the filter is mounted onto a support extending through an opening of a housing accommodating the filter;
the housing is configured and positioned such that the optical path extending through the housing extends through a center section of the filter, and
the support is rotatably secured on the housing.

15. The photometer of claim 12, further comprising at least one of:

an adjuster configured to enable and/or to perform adjustments of the center wave length by adjusting the angle of incidence by rotating the filter;
a dial, a knob or another device connected to the filter and configured to enable manual adjustment of the center wave length by adjusting the angle of incidence by rotating the filter; and
an actuator configured to rotate the filter according to a control command provided to the actuator.

16. The photometer of claim 12, wherein:
the light source is configured to provide ultraviolet light; and
the photodetector is a silicon carbide detector.

17. A method of performing photometric measurements with the photometer of claim 1, wherein the signal processing device is configured to determine the measurement signal based on the noise reduced signal, the method comprising:
a first step of determining at least one noise offset by:
exposing the photodetector to reference conditions wherein an intensity of the light received by the photodetector is essentially equal to a constant intensity smaller or equal to a lower limit of an intensity measurement range of the photometer;
recording the amplified detector signal provided by the amplifier at a time when or during a time period wherein the photodetector is exposed to the reference conditions; and
determining the respective at least one noise offset as or based on a signal amplitude of the previously recorded amplified detector signal; and
a second step of with the photometer performing at least one photometric measurement by:
exposing the photodetector to measurement conditions, wherein the light received by the photodetector corresponds to a variable to be measured;
amplifying the detector signal provided by the photodetector and determining the measurement signal in form of the noise reduced signal by subtracting the previously determined at least one noise offset from the amplified detector signal; and
based on the measurement signal determining the measurement result corresponding to the variable to be measured.

18. The method of claim 17, wherein:
a gain of the amplifier is adjustable to at least two different gain settings;
the first step further includes determining gain specific noise offsets for at least one, for at least two or for each of the gain settings, wherein each noise offset given by one of these gain specific noise offsets is determined while the amplifier is operating in the respective gain setting; and
the second step further includes determining the noise reduced signal based on the gain setting of the amplifier gain applied during the respective photometric measurement by subtracting the noise offset given by the gain-specific noise offset previously determined for the respective gain setting.

19. The method of claim 17, wherein: the reference conditions are reference conditions wherein the photodetector is covered, or reference conditions wherein a light source providing the light received by the photodetector during measurement operation of the photometer is turn off.

20. The method of claim 17, further comprising a method step of following the performance of the first step and preceding the performance of the second step:

determining a relationship between a signal amplitude of the measurement signal given by the noise reduced signal and the measured values of the variable measured by the photometer by:
  with the photometer performing calibration measurements including at least one of:
at least one measurement performed when the intensity of the light received by photodetector has a known value and at least one measurement performed when the variable measured by the photometer has a known value; and
  determining the relationship based on the known value(s) and a signal amplitude of the noise reduced signal provided by the signal processing device during the respective calibration measurement.

* * * * *